United States Patent
Barlow et al.

(10) Patent No.: US 7,533,293 B2
(45) Date of Patent: May 12, 2009

(54) SYSTEMS AND METHODS FOR CPU REPAIR

(75) Inventors: Jeff Barlow, Roseville, CA (US); Jeff Brauch, Fort Collins, CO (US); Howard Calkin, Roseville, CA (US); Raymond Gratias, Fort Collins, CO (US); Stephen Hack, Fort Collins, CO (US); Lacey Joyal, Fort Collins, CO (US); Guy Kuntz, Richardson, TX (US); Ken Pomaranski, Roseville, CA (US); Michael Sedmak, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 434 days.

(21) Appl. No.: 11/356,564

(22) Filed: Feb. 17, 2006

(65) Prior Publication Data

US 2006/0248313 A1 Nov. 2, 2006

Related U.S. Application Data

(60) Provisional application No. 60/654,255, filed on Feb. 18, 2005.

(51) Int. Cl.
*G06F 11/00* (2006.01)

(52) U.S. Cl. .......................................... 714/8; 714/710
(58) Field of Classification Search ............... 714/7, 714/8, 47, 710, 711
See application file for complete search history.

(56) References Cited

U.S. PATENT DOCUMENTS

| | | | | |
|---|---|---|---|---|
| 5,649,090 | A * | 7/1997 | Edwards et al. | 714/10 |
| 5,954,435 | A * | 9/1999 | Yoshida | 714/42 |
| 6,516,429 | B1 * | 2/2003 | Bossen et al. | 714/47 |
| 6,651,182 | B1 * | 11/2003 | Chang et al. | 714/3 |
| 6,708,294 | B1 * | 3/2004 | Nakao et al. | 714/42 |
| 6,789,048 | B2 * | 9/2004 | Arndt et al. | 702/186 |
| 6,832,329 | B2 * | 12/2004 | Ahrens et al. | 714/5 |
| 6,851,071 | B2 * | 2/2005 | Bossen et al. | 714/5 |
| 6,922,798 | B2 * | 7/2005 | Nemani et al. | 714/710 |
| 6,973,604 | B2 * | 12/2005 | Davis et al. | 714/710 |
| 7,007,210 | B2 * | 2/2006 | Fields et al. | 714/718 |
| 7,058,782 | B2 * | 6/2006 | Henderson et al. | 711/170 |
| 7,134,057 | B1 * | 11/2006 | Kaushik et al. | 714/711 |
| 7,350,119 | B1 * | 3/2008 | Zuraski et al. | 714/711 |
| 2003/0074598 | A1 * | 4/2003 | Bossen et al. | 714/6 |
| 2004/0133826 | A1 * | 7/2004 | Zhu et al. | 714/711 |

* cited by examiner

*Primary Examiner*—Marc Duncan

(57) ABSTRACT

In one embodiment, a CPU cache management system is provided. The CPU management system includes, for example, a CPU chip and cache management logic. The CPU chip include cache elements that are initially in use and spare cache elements that not initially in use. The cache management logic determines whether currently-used cache elements are faulty. If a cache element is determined to be faulty, the cache management logic schedules a reboot of the computer and swaps in a spare cache element for the faulty currently-used cache element during the reboot.

8 Claims, 6 Drawing Sheets

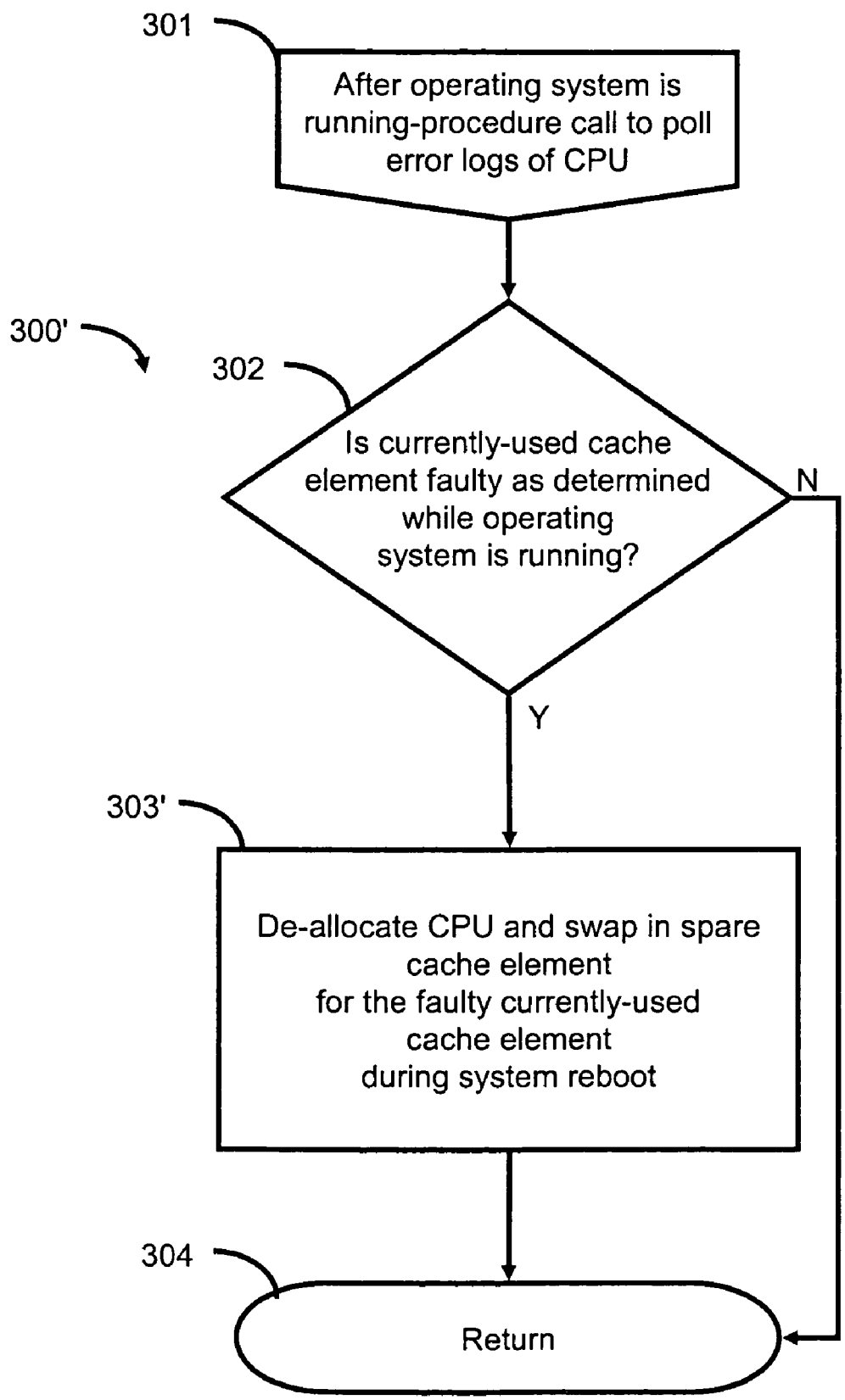

SYSTEMS AND METHODS FOR CPU REPAIR

CROSS-REFERENCE TO RELATED APPLICATIONS

This application claims priority from U.S. Provisional application Ser. No. 60/654,255 filed on Feb. 18, 2005.

This application is also related to the following US patent applications:

"Systems and Methods for CPU Repair", Ser. No. 60/254,741, filed Feb. 18, 2005, Attorney Docket No. 200310665-1; Ser. No. 60/654,741, filed Feb. 18, 2005 having the same title;

"Systems and Methods for CPU Repair", Ser. No. 60/254,259, filed Feb. 18, 2005, Attorney Docket No. 200300554-1; Ser. No. 60/654,259, filed Feb. 18, 2005 having the same title;

"Systems and Methods for CPU Repair", Ser. No. 60/254,272, filed Feb. 18, 2005, Attorney Docket No. 200300557-1; Ser. No. 60/654,272, filed Feb. 18, 2005 having the same title;

"Systems and Methods for CPU Repair", Ser. No. 60/254,256, filed Feb. 18, 2005, Attorney Docket No. 200300558-1; Ser. No. 60/654,256, filed Feb. 18, 2005 having the same title;

"Systems and Methods for CPU Repair", Ser. No. 60/254,740, filed Feb. 18, 2005, Attorney Docket No. 200300559-1; Ser. No. 60/654,740, filed Feb. 18, 2005 having the same title;

"Systems and Methods for CPU Repair", Ser. No. 60/254,739, filed Feb. 18, 2005, Attorney Docket No. 200300560-1; Ser. No. 60/654,739, filed Feb. 18, 2005 having the same title;

"Systems and Methods for CPU Repair", Ser. No. 60/254,258, filed Feb. 18, 2005, Attorney Docket No. 200310662-1; Ser. No. 60/654,258, filed Feb. 18, 2005 having the same title;

"Systems and Methods for CPU Repair", Ser. No. 60/254,744, filed Feb. 18, 2005, Attorney Docket No. 200310664-1; Ser. No. 60/654,744, filed Feb. 18, 2005 having the same title;

"Systems and Methods for CPU Repair", Ser. No. 60/254,743, filed Feb. 18, 2005, Attorney Docket No. 200310668-1; Ser. No. 60/654,743, filed Feb. 18, 2005 having the same title;

"Methods and Systems for Conducting Processor Health-Checks", Ser. No. 60/254,203, filed Feb. 18, 2005, Attorney Docket No. 200310667-1; Ser. No. 60/654,603, filed Feb. 18, 2005 having the same title; and "Methods and Systems for Conducting Processor Health-Checks", Ser. No. 60/254,273, filed Feb. 18, 2005, Attorney Docket No. 200310666-1; Ser. No. 60/654,273, filed Feb. 18, 2005 having the same title;

which are incorporated herein by reference.

BACKGROUND

At the heart of many computer systems is the microprocessor or central processing unit (CPU) (referred to collectively as the "processor.") The processor performs most of the actions responsible for application programs to function. The execution capabilities of the system are closely tied to the CPU: the faster the CPU can execute program instructions, the faster the system as a whole will execute.

Early processors executed instructions from relatively slow system memory, taking several clock cycles to execute a single instruction. They would read an instruction from memory, decode the instruction, perform the required activity, and write the result back to memory, all of which would take one or more clock cycles to accomplish.

As applications demanded more power from processors, internal and external cache memories were added to processors. A cache memory (hereinafter cache) is a section of very fast memory located within the processor or located external to the processor and closely coupled to the processor. Blocks of instructions or data are copied from the relatively slower system memory (DRAM) to the faster cache memory where they can be quickly accessed by the processor.

Cache memories can develop persistent errors over time, which degrade the operability and functionality of their associated CPU's. In such cases, physical removal and replacement of the failed or failing cache memory has been performed. Moreover, where the failing or failed cache memory is internal to the CPU, physical removal and replacement of the entire CPU module or chip has been performed. This removal process is generally performed by field personnel and results in greater system downtime. Thus, replacing a CPU is inconvenient, time consuming and costly.

SUMMARY

In one embodiment, a CPU cache management system is provided. The CPU management system includes, for example, a CPU chip and cache management logic. The CPU chip include cache elements that are initially in use and spare cache elements that not initially in use. The cache management logic determines whether currently-used cache elements are faulty. If a cache element is determined to be faulty, the cache management logic schedules a reboot of the computer and swaps in a spare cache element for the faulty currently-used cache element during the reboot.

BRIEF DESCRIPTION OF THE DRAWINGS

FIG. 3B is a high level flow chart of a second embodiment of cache management logic;

DETAILED DESCRIPTION

The following includes definition of exemplary terms used throughout the disclosure. Both singular and plural forms of all terms fall within each meaning:

"Logic", as used herein includes, but is not limited to, hardware, firmware, software and/or combinations of each to perform a function(s) or an action(s). For example, based on a desired application or needs, logic may include a software controlled microprocessor, discrete logic such as an application specific integrated circuit (ASIC), or other programmed logic device. Logic may also be fully embodied as software.

"Cache", as used herein includes, but is not limited to, a buffer or a memory or section of a buffer or memory located within a processor ("CPU") or located external to the processor and closely coupled to the processor.

"Cache element", as used herein includes, but is not limited to, one or more sections or sub-units of a cache.

"CPU", as used herein includes, but is not limited to, any device, structure or circuit that processes digital information including for example, data and instructions and other information. This term is also synonymous with processor and/or controller.

"Cache management logic", as used herein includes, but is not limited to, any logic that can store, retrieve, and/or process data for exercising executive, administrative, and/or supervisory direction or control of caches or cache elements.

"During", as used herein includes, but is not limited to, in or throughout the time or existence of; at some point in the entire time of; and/or in the course of.

Figure 1:
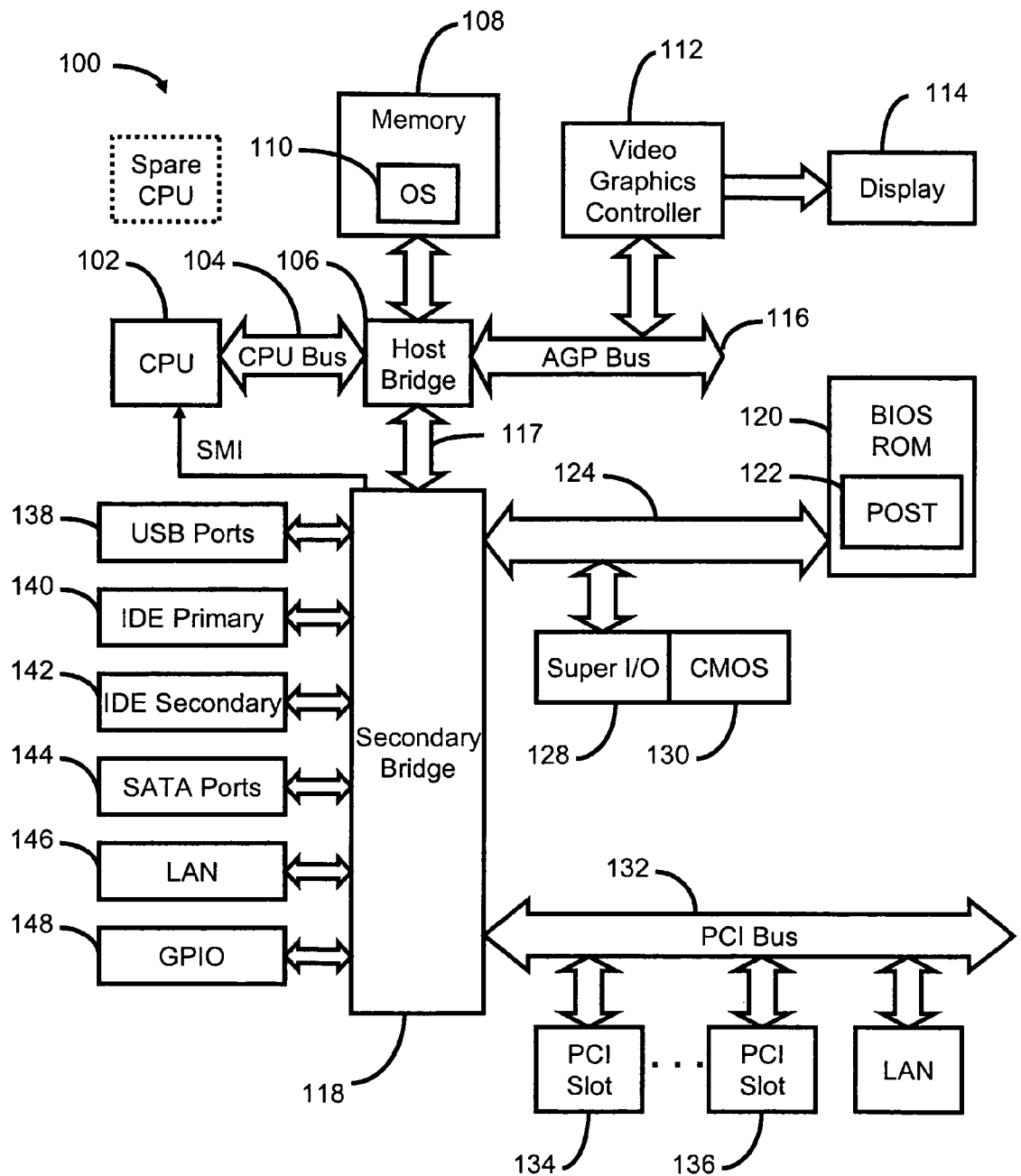
FIG. 1 is an exemplary overall system diagram.

Referring now to FIG. 1, a computer system 100 constructed in accordance with one embodiment generally includes a central processing unit ("CPU") 102 coupled to a host bridge logic device 106 over a CPU bus 104. CPU 102 may include any processor suitable for a computer such as, for example, a Pentium or Centrino class processor provided by Intel. A system memory 108, which may be is one or more synchronous dynamic random access memory ("SDRAM") devices (or other suitable type of memory device), couples to host bridge 106 via a memory bus. Further, a graphics controller 112, which provides video and graphics signals to a display 114, couples to host bridge 106 by way of a suitable graphics bus, such as the Advanced Graphics Port ("AGP") bus 116. Host bridge 106 also couples to a secondary bridge 118 via bus 117.

A display 114 may be a Cathode Ray Tube, liquid crystal display or any other similar visual output device. An input device is also provided and serves as a user interface to the system. As will be described in more detail, input device may be a light sensitive panel for receiving commands from a user such as, for example, navigation of a cursor control input system. Input device interfaces with the computer system's I/O such as, for example, USB port 138. Alternatively, input device can interface with other I/O ports.

Secondary Bridge 118 is an I/O controller chipset. The secondary bridge 118 interfaces a variety of I/O or peripheral devices to CPU 102 and memory 108 via the host bridge 106. The host bridge 106 permits the CPU 102 to read data from or write data to system memory 108. Further, through host bridge 106, the CPU 102 can communicate with I/O devices on connected to the secondary bridge 118 and, and similarly, I/O devices can read data from and write data to system memory 108 via the secondary bridge 118 and host bridge 106. The host bridge 106 may have memory controller and arbiter logic (not specifically shown) to provide controlled and efficient access to system memory 108 by the various devices in computer system 100 such as CPU 102 and the various I/O devices. A suitable host bridge is, for example, a Memory Controller Hub such as the Intel® 875P Chipset described in the Intel® 82875P (MCH) Datasheet, which is hereby fully incorporated by reference.

Referring still to FIG. 1, secondary bridge logic device 118 may be an Intel® 82801EB I/O Controller Hub 5 (ICH5)/Intel® 82801ER I/O Controller Hub 5 R (ICH5R) device provided by Intel and described in the Intel® 82801EB ICH5/82801ER ICH5R Datasheet, which is incorporated herein by reference in its entirety. The secondary bridge includes various controller logic for interfacing devices connected to Universal Serial Bus (USB) ports 138, Integrated Drive Electronics (IDE) primary and secondary channels (also known as parallel ATA channels or sub-system) 140 and 142, Serial ATA ports or sub-systems 144, Local Area Network (LAN) connections, and general purpose I/O (GPIO) ports 148. Secondary bridge 118 also includes a bus 124 for interfacing with BIOS ROM 120, super I/O 128, and CMOS memory 130. Secondary bridge 118 further has a Peripheral Component Interconnect (PCI) bus 132 for interfacing with various devices connected to PCI slots or ports 134-136. The primary IDE channel 140 can be used, for example, to couple to a master hard drive device and a slave floppy disk device (e.g., mass storage devices) to the computer system 100. Alternatively or in combination, SATA ports 144 can be used to couple such mass storage devices or additional mass storage devices to the computer system 100.

The BIOS ROM 120 includes firmware that is executed by the CPU 102 and which provides low level functions, such as access to the mass storage devices connected to secondary bridge 118. The BIOS firmware also contains the instructions executed by CPU 102 to conduct System Management Interrupt (SMI) handling and Power-On-Self-Test ("POST") 122. POST 102 is a subset of instructions contained with the BIOS ROM 102. During the boot up process, CPU 102 copies the BIOS to system memory 108 to permit faster access.

The super I/O device 128 provides various inputs and output functions. For example, the super I/O device 128 may include a serial port and a parallel port (both not shown) for connecting peripheral devices that communicate over a serial line or a parallel pathway. Super I/O device 108 may also include a memory portion 130 in which various parameters can be stored and retrieved. These parameters may be system and user specified configuration information for the computer system such as, for example, a user-defined computer set-up or the identity of bay devices. The memory portion 130 in National Semiconductor's 97338VJG is a complementary metal oxide semiconductor ("CMOS") memory portion. Memory portion 130, however, can be located elsewhere in the system.

Figure 2:
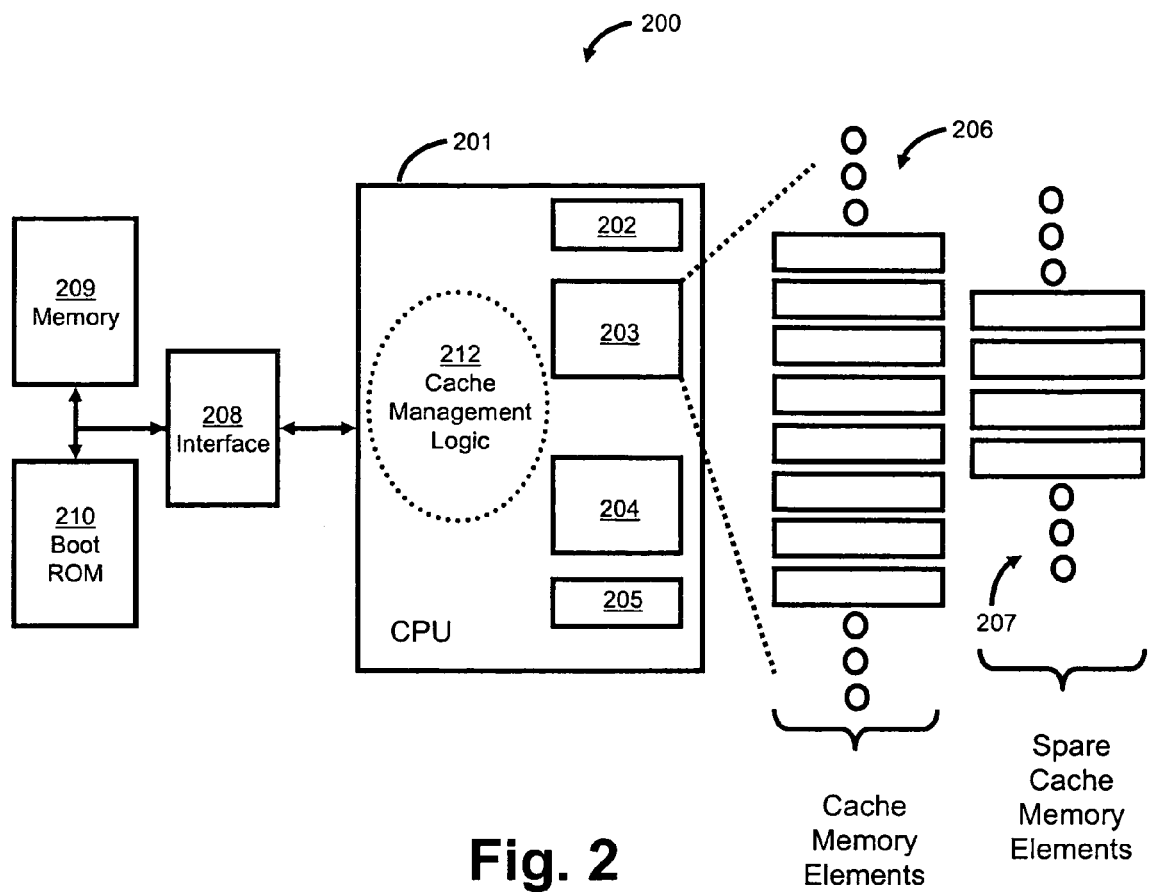
FIG. 2 is an exemplary diagram of a CPU cache management system.

Referring to FIG. 2, one embodiment of the CPU cache management system 200 is shown. CPU cache management system 200 includes a CPU chip 201 having various types of cache areas 202, 203, 204, 205. Although only one CPU chip is shown in FIG. 2, more than one CPU chip may be used in the computer system 100. The types of cache area may include, but is not limited to, D-cache elements, I-cache elements, D-cache element tags, and I-cache element tags. The specific types of cache elements are not critical.

Within each cache area 202, 203, 204, 205 are at least two subsets of elements. For example, FIG. 2 shows the two subsets of cache elements for cache area 203. The first subset includes data cache elements 206 that are initially being used to store data. The second subset includes spare cache elements 207 that are identical to the data cache elements 206, but which are not initially in use. When the CPU cache areas are constructed, a wafer test is applied to determine which cache elements are faulty. This is done by applying multiple voltage extremes to each cache element to determine which cache elements are operating correctly. If too many cache elements are deemed faulty, the CPU is not installed in the computer system 100. At the end of the wafer test, but before the CPU is installed in the computer system 100, the final cache configuration is laser fused in the CPU chip 201. Thus, when the computer system 100 is first used, the CPU chip 201 has permanent knowledge of which cache elements are faulty and is configured in such a way that the faulty cache elements are not used.

As such, the CPU chip 201 begins with a number of data cache elements 206 that have passed the wafer test and are currently used by the CPU chip. In other words, the data cache elements 206 that passed the wafer test are initially presumed to be operating properly and are thus initially used or allocated by the CPU. Similarly, the CPU chip begins with a number of spare or non-allocated cache elements 207 that have passed the wafer test and are initially not used, but are available to be swapped in for data cache elements 206 that become faulty.

Also included in the CPU cache management system 200 is logic 212. In the exemplary embodiment of FIG. 2, the logic 212 is contained in the CPU core logic. However, logic 212 may be located, stored or run in other locations. Furthermore, the logic 212 and its functionality may be divided up into different programs, firmware or software and stored in different locations.

Connected to the CPU chip 201 is an interface 208. The interface 208 allows the CPU chip 201 to communication with and share information with a non-volatile memory 209 and a boot ROM. The boot ROM contains data and information needed to start the computer system 100 and the non-volatile memory 209 may contain any type of information or data that is needed to run programs or applications on the computer system 100, such as, for example, the cache element configuration.

Figure 3A:
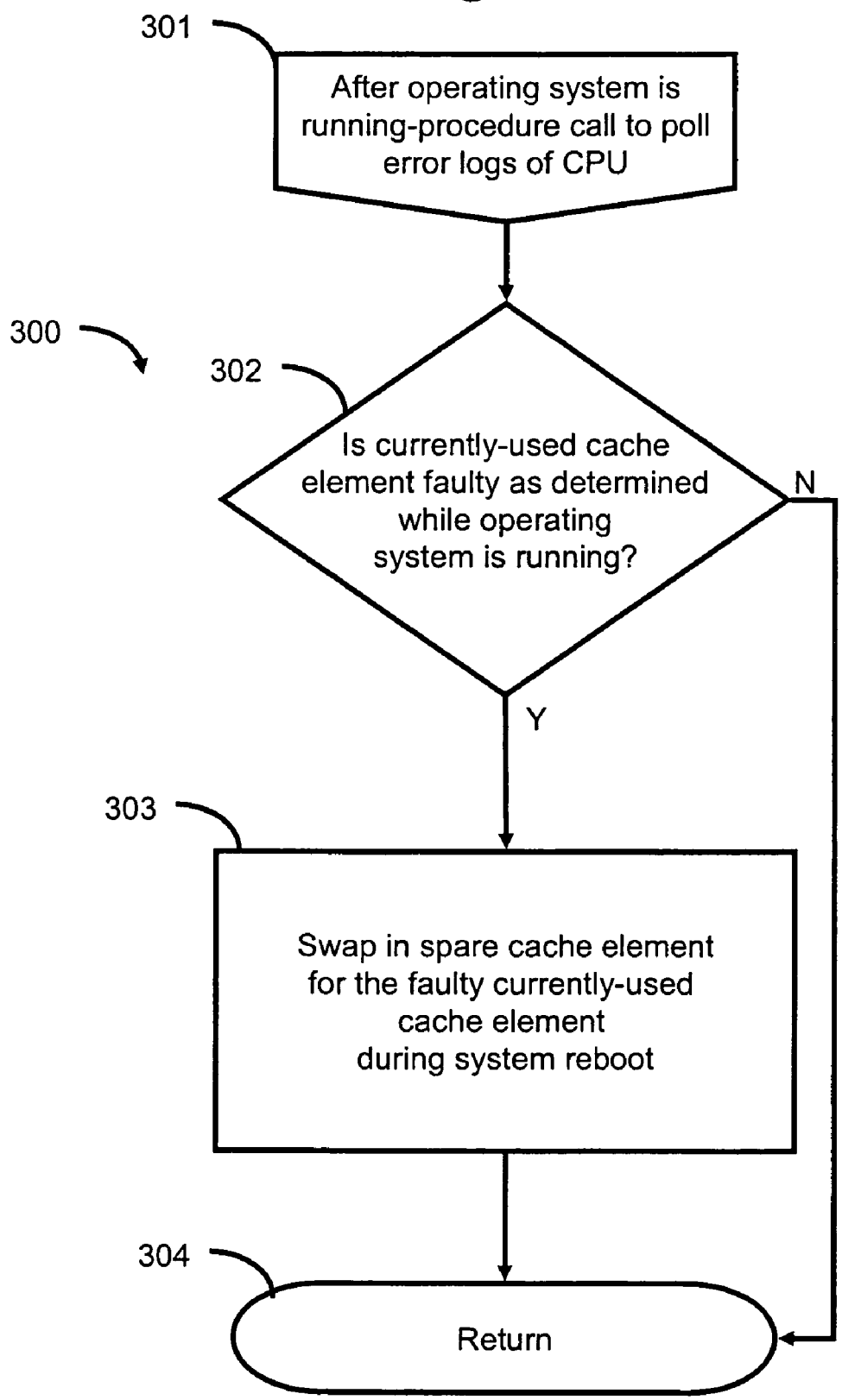
FIG. 3A is a high level flow chart of one embodiment of cache management logic.

Now referring to FIG. 3A, a high level flow chart of an exemplary process of the cache management logic 300 is shown. The rectangular elements denote "processing blocks" and represent computer software instructions or groups of instructions. The diamond shaped elements denote "decision blocks" and represent computer software instructions or groups of instructions which affect the execution of the computer software instructions represented by the processing blocks. Alternatively, the processing and decision blocks represent steps performed by functionally equivalent circuits such as a digital signal processor circuit or an application-specific integrated circuit (ASIC). The flow diagram does not depict syntax of any particular programming language. Rather, the flow diagram illustrates the functional information one skilled in the art may use to fabricate circuits or to generate computer software to perform the processing of the system. It should be noted that many routine program elements, such as initialization of loops and variables and the use of temporary variables are not shown.

The cache management logic refers generally to the monitoring, managing, handling, storing, evaluating and/or repairing of cache elements and/or their corresponding cache element errors. Cache management logic can be divided up into different programs, routines, applications, software, firmware, circuitry and algorithms such that different parts of the cache management logic can be stored and run from various different locations within the computer system 100. In other words, the implementation of the cache management logic 40 can vary.

The cache management logic 300 begins after the operating system of the computer system 100 is up and running. During boot up of the computer system 100, the CPU 201 may have a built-in self test, independent of the cache management logic, in which the cache elements are tested to make sure that they are operating correctly. However, the testing must be performed during the booting process. This results in greater downtime and less flexibility since the computer system 100 must be rebooted in order to determine if cache elements are working properly. However, as shown in FIG. 3A, the cache management logic may be run while the operating system is up and running. As a result, the computer system 100 may monitor and locate faulty cache elements continuously without having to reboot the computer system. Thus, the computer system 100 knows of faulty cache elements sooner and can repair the faulty cache elements sooner.

While the operating system is running, the cache management logic 300 determines whether any of the currently-used cache elements within the CPU are faulty (step 301). This is accomplished, for example, by totaling the number of errors that each cache element accumulates using or implementing a standard error-correction code (ECC) within the CPU and comparing that totaled number against a predetermined threshold. If a currently-used cache element is not faulty (step 301), the cache management logic simply returns to normal operation (step 303). However, if a currently-used cache element is determined to be faulty (step 302), the cache management logic 300 swaps in a spare cache element for the faulty cache element during the next system reboot, at step 302.

FIG. 3B illustrates a second embodiment 300' of cache management logic. Cache management logic 300' is substantially similar to cache management logic 300 of FIG. 3A except that the CPU is de-allocated after a currently-used cache element is determined to be faulty and the cache management logic 300' then swaps in a spare cache element for the faulty cache element in the de-allocated CPU during the next system reboot as shown in step 303'.

Figure 4:
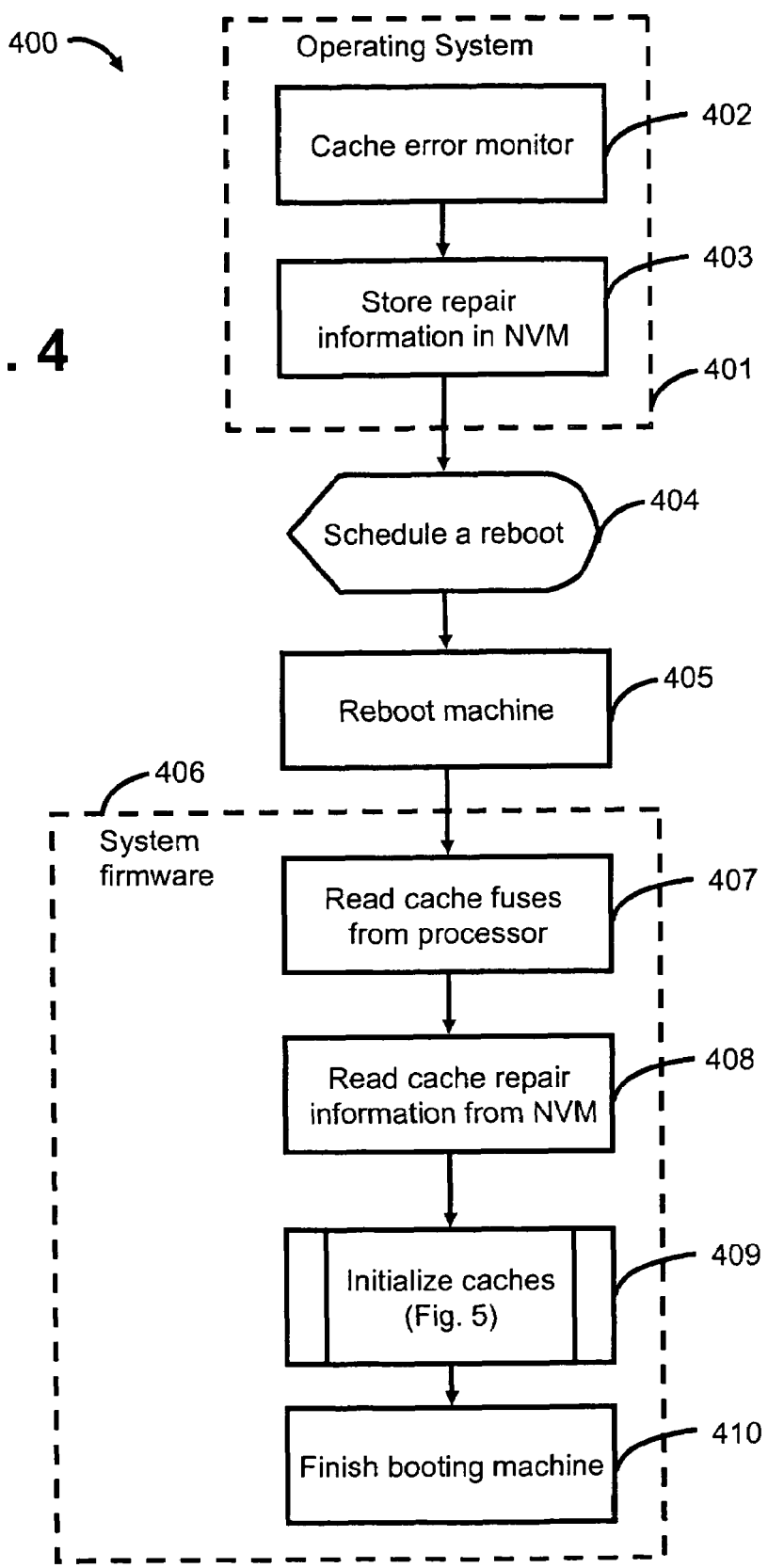
FIG. 4 is a flow chart of the cache management logic.

Now referring to FIG. 4, an exemplary process of the cache management logic 300 is shown. The cache management logic refers generally to the monitoring, managing, handling, storing, evaluating and repairing of cache elements and their corresponding cache element errors. Cache management logic can be divided up into different programs, routines, applications, software, firmware, circuitry and algorithms such that different parts of the cache management logic can be stored and run from various different locations within the computer system 100. In other words, the implementation of the cache management logic may vary.

In the embodiment shown in FIG. 4, the cache management logic begins by having logic within the operating system 401 monitor the CPU cache for cache element errors, step 402. While the embodiment shown in FIG. 4 illustrates that the monitoring is performed by part of the cache management logic in the operating system, the monitoring may also be performed from a diagnostics program running on the system firmware as well. During the monitoring of the cache elements, the cache management logic determines that a cache element is faulty, based on, for example, the number of errors occurring in a particular cache element exceeds a predetermined threshold number. If the monitoring process determines that a cache element need to be repaired, the repair information is stored in the non-volatile memory (step 403) and the system administration is informed that a reboot is required (step 404).

Subsequently, the machine or computer system 100 is shutdown and rebooted (step 405). During the reboot, the system firmware (part of the cache management logic, 406) reads cache fuse data from the CPU and stores that fuse information into the non-volatile memory (step 407). Subsequently, the system firmware reads the cache configuration from the non-volatile memory (step 408). Then, armed with the cache configuration, the system firmware initializes each cache (step 409). The initialization process is explained in more detail below with respect to FIG. 5. After the caches are initialized and all necessary cache element repairs are successfully made, the system firmware finishes booting the machine and performing normal system self-test on the way to booting the operating system (step 410).

Figure 5:
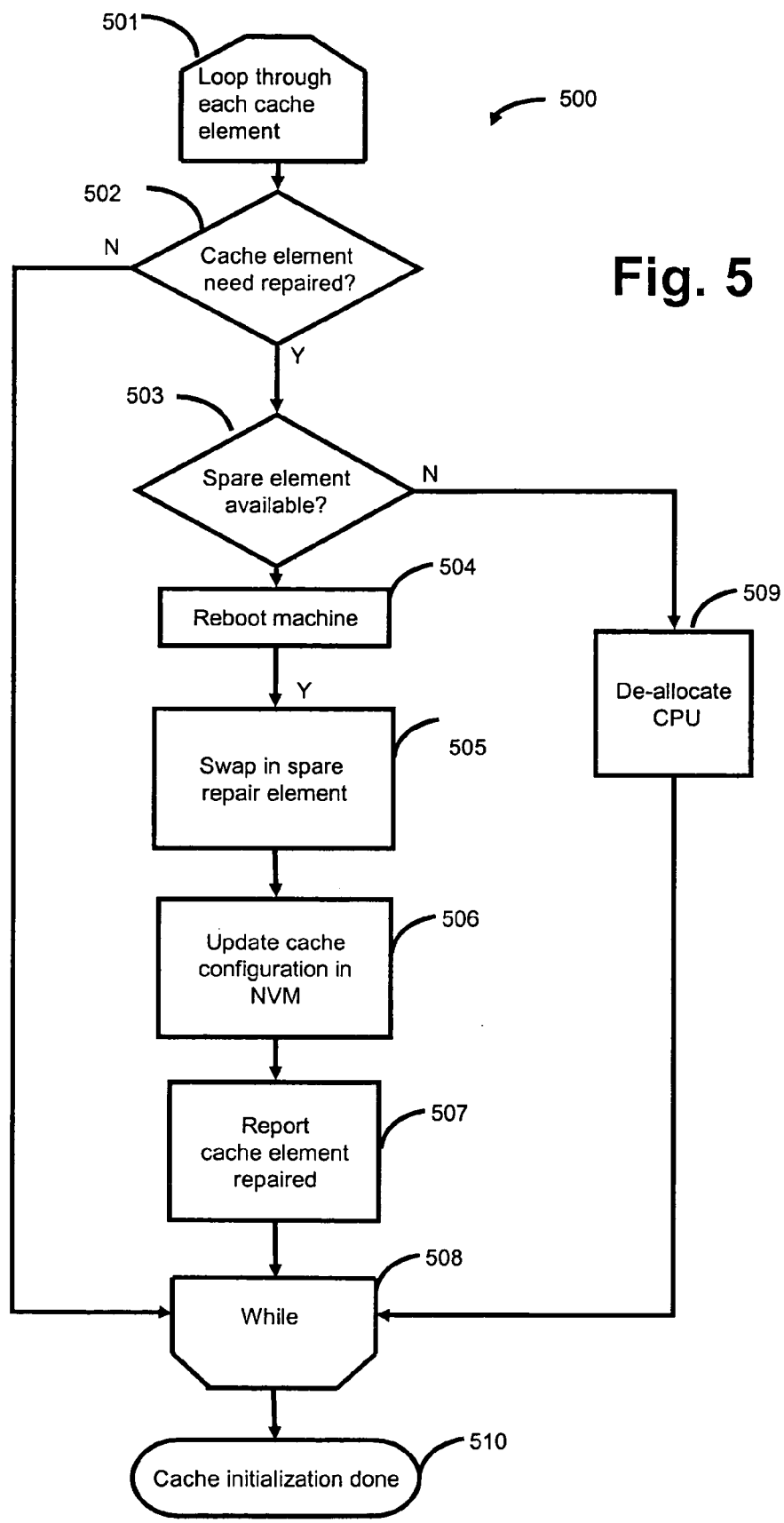
FIG. 5 is a flow chart of the repair process of the cache management logic.

Referring now to FIG. 5, one embodiment of the cache initialization process 500 is illustrated. The process begins by looping through each cache element, step 501, and repairing cache elements as needed. For each cache element, the cache management logic determines, based on the cache repair information that was read from the non-volatile memory, if the cache element needs to be repaired (step 502). If the cache element does not need to be repaired, the process loops through the next cache element (step 507).

However, if the cache element is in need of repair, the cache management logic determines if a spare cache element is available (step 503). If a spare cache element is not available, the cache management logic de-allocates the CPU (step 508) and moves to the next cache element on the next CPU. If a spare cache element is available, the cache management logic swaps in the spare cache element for the faulty cache element (step 504). The "swapping in" process refers generally to the reconfiguration and re-allocation within the computer system 100 and its memory 108 such that the computer system 100 recognizes and utilizes the spare (or swapped in) device in place of the faulty (or de-allocated) device, and no longer utilizes the faulty (or de-allocated) device. The "swapping in" process for cache elements may be accomplished, for example, by using associative addressing. More specifically, each spare cache element has an associative addressing register and a valid bit associated with it. To repair a faulty cache element, the address of the faulty cache element is entered into the associative address register on one of the spare cache elements, and the valid bit is turned on. The hardware may then automatically access the replaced element rather than the original cache element.

Once the spare cache element is swapped in for the faulty cache element, the cache configuration is updated in the non-volatile memory (step 505). Subsequently, the cache management logic reports that the cache element has been successfully repaired (step 506) and the process loops through the next cache element (step 507). The looping continues until each cache element has been addressed, at which time the cache initialization is considered finished (step 509) and the system firmware finishes booting the machine (step 410).

The above description of some of the embodiments of the present invention has been given by way of example. From the disclosure given, those skilled in the art will not only understand the present invention and its attendant advantages, but will also find apparent various changes and modifications to the structures and methods disclosed. It is sought, therefore, to cover all such changes and modifications as fall within the spirit and scope of the invention, as defined by the appended claims, and equivalents thereof.

What is claimed is:

1. A method for repairing a computer system having an operating system comprising the steps of:
    monitoring at least one cache element associated with at least one CPU for at least one cache error;
    recording cache error information associated with said at least one cache error;
    determining whether said at least one cache element is faulty based on said cache error information;
    de-allocating said at least one CPU if said at least one cache element is faulty;
    determining if at least one spare cache element is available if said at least one cache element is faulty;
    generating a system reboot;
    reading cache fuse data during said system reboot; and
    swapping in said at least one spare cache element if said at least one spare cache element is available and said at least one cache element is faulty during said system reboot.

2. The method of claim 1, wherein said at least one cache element is determined to be faulty if a total number of errors occurring from said at least one cache element exceeds a predetermined threshold.

3. The method of claim 2, wherein said predetermined threshold is based on a total number of errors occurring from said cache element over a predetermined time period.

4. The method of claim 1 further comprising the step of: de-allocating said at least one CPU permanently if said at least one spare cache element is not available.

5. The method of claim 4 further comprising the steps of: determining whether a spare CPU is available; and swapping in said spare CPU for said de-allocated CPU if said spare CPU is available.

6. The method of claim 1 further comprising the step of: updating a cache configuration in a memory.

7. The method of claim 1 further comprising the step of: reading cache error information during said system reboot.

8. The method of claim 1 further comprising the step of: re-allocating said de-allocated CPU if said at least one spare cache element is swapped in for said faulty allocated cache element.

* * * * *